(12) United States Patent
Ogiso

(10) Patent No.: US 7,157,980 B2
(45) Date of Patent: *Jan. 2, 2007

(54) CLOCK CONVERTER AND ELECTRONIC APPARATUS WITH THE SAME

(75) Inventor: Hiroyuki Ogiso, Ina (JP)

(73) Assignee: Seiko Epson Corporation (JP)

( * ) Notice: Subject to any disclaimer, the term of this patent is extended or adjusted under 35 U.S.C. 154(b) by 80 days.

This patent is subject to a terminal disclaimer.

(21) Appl. No.: 10/670,986

(22) Filed: Sep. 25, 2003

(65) Prior Publication Data

US 2004/0119545 A1 Jun. 24, 2004

(30) Foreign Application Priority Data

Sep. 25, 2002 (JP) ............................. 2002-279284

(51) Int. Cl.
*H03L 7/00* (2006.01)
(52) U.S. Cl. .................. 331/34; 331/74; 331/116 M; 331/107 A
(58) Field of Classification Search ............ 331/107 A, 331/116 R, 116 FE, 73, 116 M, 74, 135, 331/158, 160, 161, 34; 327/156, 158
See application file for complete search history.

(56) References Cited

U.S. PATENT DOCUMENTS

| 6,606,007 | B1 * | 8/2003 | Washburn ............... 331/116 R |
| 6,703,877 | B1 * | 3/2004 | Kobayashi et al. ......... 327/156 |
| 2001/0017560 | A1 * | 8/2001 | Kato et al. ................... 327/175 |
| 2002/0125964 | A1 * | 9/2002 | Ash ....................... 331/107 A |

FOREIGN PATENT DOCUMENTS

| JP | 10-261956 | 9/1998 |
| JP | 10-319149 | 12/1998 |

* cited by examiner

*Primary Examiner*—Joseph Chang
(74) *Attorney, Agent, or Firm*—Harness, Dickey & Pierce, P.L.C.

(57) ABSTRACT

A voltage controlled oscillating means in a clock converter outputs a positive feedback signal for a positive feedback loop from one output terminal of buffer means forming a portion of a positive feedback loop using voltage controlled phase shifting means and outputs a PLL feedback signal from the other output terminal of the buffer means. The PLL feedback signal is fed back to phase detector means through a signal transmitting circuit. As a result, it is possible to form a PLL feedback loop, which is not affected by the load to thus output a stable clock signal of high frequency. Furthermore, it is possible to realize a small clock converter by narrowing the line width of a wiring pattern in the signal transmitting circuit.

10 Claims, 12 Drawing Sheets

CLOCK CONVERTER AND ELECTRONIC APPARATUS WITH THE SAME

BACKGROUND OF THE INVENTION

1. Technical Field of the Invention

The present invention relates to a clock converter using a phase locked loop (PLL) circuit and an electronic apparatus using the same, and more particularly, to a clock converter for multiplying a basic clock signal from several kilohertz (for example, 8 kHz) to several hundred megahertz (for example, 622.08 MHz) with a clock signal of a high frequency no less than several hundred megahertz (for example, 622.08 MHz), and to an electronic apparatus using the same.

2. Related Art

Communication apparatuses such as telephones, mobile telephones, facsimiles, and personal computers (PC) transmit and receive communication data with the speed of a clock signal increased by a clock converter. Also, the bandwidth of communication networks has recently been increased. Accordingly, data need to be transmitted and received in a high frequency band that is more than 400 MHz, according to market requirements. A clock converter for coping with an increase in communication speed requires high frequency stability for high frequency bands, temperature compensation for an oscillation frequency within the operating temperature range of the communication apparatus, and a small amount of jitter of a clock signal output from an oscillation circuit.

Furthermore, in order to convert a clock signal to have high speed, it is necessary that an input clock signal be synchronized with an output clock signal in a clock converter. Accordingly, a multiplication ratio of the input and output clock signals is a integer. It is necessary that the rising and falling waveforms of the input clock signal and the output clock signal coincide with each other. In order to realize such characteristic conditions, in general, phases are synchronized and a frequency is multiplied by the clock converter using a PLL circuit. Recently, a clock converter for high speed communications for multiplying a basic clock signal of several kilohertz (for example, 8 kHz) to a high frequency clock signal no less than several hundred megahertz (for example, 622.08 MHz) is also realized as the communication speed increases.

An oscillation frequency of the clock converter is determined by a VCO (voltage controlled oscillator). Also, because, for example, an AT crystal oscillator oscillating by several tens MHz is used as an oscillation device of the VCO, such a VCO is referred to as a VCXO (voltage controlled X'tal oscillator).

FIG. 9 is a conceptual view illustrating the structure of a general VCXO. In FIG. 9, an oscillator 18 generates a signal of a predetermined frequency on the basis of the oscillation of an AT crystal oscillator 17. At this time, in order to output a signal of a high frequency no less than several hundred megahertz, a frequency multiplier 19 is provided to multiply an oscillation frequency from the oscillator 18 by an integer and to output a signal of a predetermined high frequency. Recently, there exists an AT oscillator of more than 100 MHz. In this case, it is possible to output a signal of a high frequency of no less than several hundred megahertz without the frequency multiplier 19. Also, it is possible to differentially output a plurality of output signals from a differential converter 20 in consideration of an interface with a load circuit.

FIG. 10 is a block diagram illustrating a structure of a conventional clock converter. A clock converter 1' includes a phase detector IC chip 2 (phase detector means), a LPF (low pass filter) 3, a VCXO (voltage controlled X'tal oscillator) 4' and a signal transmitting circuit 5. The phase detector IC chip 2 includes a phase detector circuit (PD) 6, a feedback frequency dividing circuit (1/N) 7 and an input frequency dividing circuit (1/P) 8. The structure of the clock converter 1' is the same as the structure of a common PLL circuit. The detailed description of the operations of the respective members is omitted. For example, clock signals CK+ and CK- of, for example, 20 MHz input to the clock converter 1' are multiplied to clock signals OUT+ and OUT- of, for example, 100 MHz and are output.

In order to PLL feedback an output signal of the VCXO 4', a PLL feedback loop is formed from a differential amplifying circuit, which is formed of an ECL, of a output step (not shown) in the VCXO 4' to an input step of the feedback frequency dividing circuit 7 of the phase detector IC chip 2 through the signal transmitting circuit 5. Also, because a PECL (positive emitter coupled logic) is commonly used as the differential amplifying circuit of the output step of the VCXO 4', hereinafter, the differential amplifying circuit may be referred to as a PECL. The input step of the feedback frequency dividing circuit 7 in the phase detector IC chip 2 may be formed of the differential amplifying circuit (that is, the PECL) or a differential CMOS circuit.

FIG. 11 is a block diagram of a signal transmitting circuit positioned between the PECL of the output step of the VCXO and the PECL of the input step of the feedback frequency dividing circuit 7 of the phase detector IC chip in the clock converter illustrated in FIG. 10. That is, FIG. 11 illustrates the interface between the PECL of the output step of the VCXO (hereinafter, a VCXO·PECL 4'a) and the PECL of the input step of the feedback frequency dividing circuit 7 of the phase detector IC chip 2 (hereinafter, a feedback frequency dividing circuit·PECL 7a). At this time, the impedance standard of the interface between the VCXO·PECL 4'a and the feedback frequency dividing circuit·PECL 7a is 50 Ω. Therefore, two transmission line of impedances Z1 and Z2 (wherein each transmission line has impedance of 50 Ω) connect between output terminals T'2 and T'3 of the VCXO·PECL 4'a and input terminals T7 and T8 of the feedback frequency dividing circuit·PECL 7a. Furthermore, the voltage applied to each termination of the feedback frequency dividing circuit·PECL 7a having the transmission line impedances Z1 and Z2 is divided by a bias resistance.

FIG. 12 is a block diagram of a signal transmitting circuit between the PECL of the output step of the VCXO and the differential CMOS of the input step of the feedback frequency dividing circuit 7 in the clock converter illustrated in FIG. 10. That is, FIG. 12 illustrates the interface between the PECL of the output step of the VCXO (the VCXO·PECL 4'a) and the differential CMOS of the input step of the feedback frequency dividing circuit 7 (the feedback frequency dividing circuit differential CMOS 7b). One wiring line has an AC coupling capacitor C51 midway, and the other wiring line is terminated by a resistor R56 at the VCXO·PECL 4'a and is terminated by a parallel circuit of a capacitor C52 and a resistor R54 at the feedback frequency dividing circuit differential CMOS 7b side, between the output terminals T'2 and T'3 of the VCXO·PECL 4'a and the input terminals T7 and T8 of the feedback frequency dividing circuit·differential CMOS 7b.

That is, in the conventional clock converter 1', as illustrated in FIG. 10, the two wiring lines of the PLL feedback loop are drawn out from the output terminals T2 and T3 of the VCXO 4' and connected to the input terminals T7 and T8 of the feedback frequency dividing circuit 7 in the phase detector IC chip 2 through the signal transmitting circuit 5. In particular, when a feedback signal of a clock signal no less than several hundred megahertz is transmitted by the PLL feedback loop, it is necessary that the impedance matching be taken in the interface between an input and an output, or transmission lines. Therefore, the impedance is matched by establishing transmission line impedances Z1 and Z2 of 50 Ω as the interface between an input and an output as illustrated in FIG. 11 or by connecting a resistor or a capacitor to input and output as illustrated in FIGS. 11 and 12.

When a load circuit is connected to the output of the clock converter 1', it has a negative influence that the output signals OUT+ and OUT− of the VCXO 4' change or the waveform amplitudes of the output signals OUT+ and OUT− reduce due to the operation state of load. Therefore, a PLL feedback signal by a PLL feedback loop becomes unstable. Accordingly, hunting may be caused in the overall system of the clock converter 1'. In order to reduce the bad influences of the PLL feedback loop, measures for reducing the influences of the load circuit of the PLL feedback loop by connecting a buffer circuit (not shown) to the output of the VCXO 4' are taken. However, in order to provide such means, it is necessary to determine component constants by cut and try caused by actual load and to add a large number of parts. Accordingly, it is impossible to minimize the clock converter 1' and to reduce the price of the clock converter 1'.

Furthermore, in the case of using the AT crystal oscillator 17 as the oscillation device as illustrated in FIG. 9, the principal vibration and secondary vibration are simultaneously excited. Accordingly, many resonance points exist. Moreover, the frequency multiplier 19 generates a high frequency of integer times as large as the principal vibration. Accordingly, spurious or noise exists in an output signal to thus generate jitter in the output signal. Therefore, it is impossible to reduce jitter. Furthermore, the VCXO may be large-sized by providing the frequency multiplier 19.

Also, as illustrated in FIG. 11, in the case where both the differential amplifying circuit of the VCXO and the differential amplifying circuit of the feedback frequency dividing circuit 7 are PECLs, the PECLs are commonly used for a clock converter where a conversion frequency is no less than several hundred megahertz (for example, 622.08 MHz). However, it causes various problems as follows. Firstly, because a power source and a ground in each functional block in FIG. 10 are shared and have low impedance, when the electric potential of the power source or the ground changes, noise overlaps, thus mutually influencing each functional block. For example, the switching noise in the phase detector circuit 6 is transmitted to another functional block such as the VCXO 4' through the power source or the grand.

Secondly, the substrate, on which the respective parts of the clock converter 1' are mounted, is small such that the size of the substrate is about 20 mm×30 mm. Therefore, it is impossible to isolate the parts from each other because the parts are close to each other. Accordingly, the parts are easily electronically coupled or capacitively coupled with each other and electrically have bad influences on each other. Thirdly, although a differential amplifying circuit where a S/N ratio is excellent by removing differential noise caused by a differential operation is used, because the size of the substrate is restricted, it is impossible to form a differential amplifying circuit so as to be operated by a plurality of input and output signals in the respect of space. Fourthly, it is a standard specification to use a strip line of 50 Ω as transmission line impedances Z1 and Z2 in the high frequency circuit in which clock signal has a frequency no less than, for example, 200 MHz when a signal is transmitted and received as illustrated in FIG. 11. However, a wiring space is needed for forming the transmission line impedances Z1 and Z2. As a result, there occurs a problem that the clock converter 1' is large-sized.

Also, as illustrated in FIG. 12, when the differential amplifying circuit of the VCXO is the PECL and the differential amplifying circuit of the feedback frequency dividing circuit 7 is the CMOS circuit, which is commonly used for a clock converter where a conversion frequency is no more than 100 MHz, it causes the following problem. That is, as illustrated in FIG. 12, when the bias voltage of the VCXO·PECL 4'*a* is different from the bias voltage of the feedback frequency dividing circuit·differential CMOS 7*b*, it is necessary to connect the AC coupling capacitor C51 between the input and the output of the PLL feedback loop. Therefore, it is necessary to directly connect a termination resistor R55 to the VCXO·PECL 4'*a* and drop the termination resistor R55 to the ground.

Furthermore, in this case, it is necessary that the value of the termination resistor R55 be equal to 50 Ω, the impedance value of the transmission line impedances Z1 and Z2 shown in FIG. 11. Therefore, the current flowing through the termination resistor R55 varies according to a power source voltage, however, significantly increases to, for example, 50 to 60 mA. Accordingly, the power consumption increases, which is not suitable for reducing power consumption. When the power source voltage supplied to the clock converter is Vcc, the bias voltage is commonly Vcc-2V in the VCXO·PECL 4'*a* and ½ Vcc in the feedback frequency dividing circuit·differential CMOS 7*b*.

According to the above problems, one object of the present invention is to provide a clock converter, which is miniaturized by reducing a wiring pattern and outputs a stable clock signal of high frequency by performing a PLL feedback so as not to be affected by a load circuit and, and an electronic apparatus with the same.

SUMMARY

In order to achieve the above object, according to a first embodiment, there is provided a clock converter for synchronizing the phase of a phase locked loop (PLL) feedback signal output from voltage controlled oscillating means with the phase of an input signal using phase detector means, thus outputting a clock signal of a predetermined frequency, wherein the voltage controlled oscillating means outputs a positive feedback signal for a positive feedback loop from one output terminal of buffer means and outputs the PLL feedback signal from another output terminal of the buffer means, the buffer means forming a portion of the positive feedback loop using the voltage controlled phase shifting means.

According to the first embodiment, among the two output terminals of the buffer means forming a portion of the positive feedback loop, which uses the voltage controlled phase shifting means, one of the terminals is used for a PLL feedback loop, and the other is used for the positive feedback loop. Therefore, only one wiring line is necessary for the PLL feedback loop, and the PLL feedback loop from the output circuit of the clock converter is unnecessary. Accordingly, the signal of the PLL feedback loop does not change according to a load.

The buffer means of the voltage controlled oscillating means in the clock converter according to the second embodiment is formed of an ECL (emitter coupled logic) differential amplifying circuit.

According to the second embodiment, it is possible to easily integrate the buffer means as an IC (integrated circuit) and to simplify the structure of the buffer means by using the ECL differential amplifying circuit for the buffer means forming the voltage controlled oscillating means.

In a clock converter according to a third embodiment, the PLL feedback signal output from the buffer means of the voltage controlled oscillating means is fed back to the phase detector means through signal transmitting means for controlling impedance and feedback frequency dividing means for dividing the frequency of the PLL feedback signal.

According to the third embodiment, the signal transmitting means for controlling impedance can take the excellent impedance matching between the buffer means of the voltage controlled oscillating means and the feedback frequency dividing means and set the voltage level of the PLL feedback signal input to the feedback frequency dividing means to be high. Therefore, the rise and fall of the PLL feedback signal are generated to be steep. Accordingly, it is possible to stabilize the differential operation and to prevent a wrong operation in the feedback frequency dividing means.

In the signal transmitting means of a clock converter according to a fourth embodiment, the PLL feedback signal supplied from the buffer means is supplied to a first connection point between a first resistor and a second resistor among first to third resistors connected in series between a power source and a ground, a second connection point between the second resistor and the third resistor is connected to the ground through a first capacitor, the first connection point is connected to a first input terminal of a differential ECL amplifier in the feedback frequency dividing means, and the second connection point is connected to a second input terminal of the differential ECL amplifier in the feedback frequency dividing means.

According to the fourth embodiment, in the case of forming the signal transmitting means between the differential ECL amplifier of the output step of the buffer means and the differential ECL amplifier of the input step of the feedback frequency dividing means forming the phase detector means, that is, between the differential ECL amplifiers, it is unnecessary to use a strip line of 50 Ω or an dedicated cable like in a conventional technology. Furthermore, It is possible to form a PLL feedback loop including DC bias means and to perform impedance matching by laying out the wiring pattern and the parts on the substrate. Accordingly, it is possible to form the signal transmitting means in a far smaller space.

In the signal transmitting means of a clock converter according to a fifth embodiment, the PLL feedback signal supplied from the buffer means is supplied to a first connection point between the first resistor and the second resistor among first to third resistors connected in series between a power source and a ground through a second capacitor, a second connection point between the second resistor and third resistor is connected to the ground through a first capacitor, the first connection point is connected to a first input terminal of a differential CMOS amplifier in the feedback frequency dividing means, and the second connection point is connected to a second input terminal of the differential CMOS amplifier in the feedback frequency dividing means.

According to the fifth embodiment, because it is possible to use a high impedance line for the PLL feedback loop between the differential ECL amplifier of the buffer means and the differential CMOS amplifier in the feedback frequency dividing means, it is possible to reduce the line width of the wiring pattern and to form the substrate in a small space. Also, it is possible to increase the termination resistor of the differential ECL amplifier of the buffer means forming the voltage controlled oscillating means by increasing the impedance of the PLL feedback loop. Accordingly, it is possible to reduce the power consumption by the clock converter.

In a clock converter according to a sixth embodiment, when the resistance value of the second resistor is $R_M$ and the resistance values of the first resistor and the third resistor connected to both ends of the second resistor are $R_H$ and $R_L$, respectively, then $R_H \gg R_M$ and $R_L \gg R_M$.

According to the sixth embodiment, in the signal transmitting means, it is possible to improve the impedance matching between the buffer means and the feedback frequency dividing means or to increase the amplitude of the PLL feedback loop signal by having the resistance values of the first resistor and the third resistor at the input side of the ECL differential amplifier or the differential CMOS circuit of the feedback frequency dividing means larger than the resistance value of the second resistor, respectively. Accordingly, it is possible to stabilize the differential operation and to prevent the wrong operation of the ECL differential amplifier or the differential CMOS circuit of the feedback frequency dividing means by making the rise and fall of the PLL feedback loop signal steep.

In a clock converter according to a seventh embodiment, an output terminal of the differential amplifying circuit forming the buffer means of the voltage controlled oscillating means is terminated by a resistor with a resistance value larger than the value of the output impedance of the differential amplifying circuit.

According to the seventh embodiment, it is possible to reduce the power consumption by an emitter open-type differential ECL amplifier used for the differential amplifying circuit by having the resistance value of the termination resistor connected to the output terminal of the differential amplifying circuit forming the buffer means of the voltage controlled oscillating means larger than the value of the output impedance of the differential amplifying circuit.

In a clock converter according to an eighth embodiment, the first capacitor in the feedback frequency dividing means is formed between a pattern formed on one surface of a substrate made of a high-dielectric material having a relative dielectric constant $\epsilon$ of no less than 4 and the other surface of the substrate, whose overall surface is grounded, to remove high frequency noise.

According to the eighth embodiment, because the wiring pattern is formed on the substrate of high permittivity and a bypass capacitor is added around the input terminal of the differential ECL amplifier of the feedback frequency dividing means, to which a high frequency signal is input, a first capacitor with small capacitance is formed between the wiring pattern on the substrate of high permittivity and the pattern formed on overall surface of the other surface of the substrate. Accordingly, It is possible to remove high frequency noise through the first capacitor.

The voltage controlled oscillating means in a clock converter according to a ninth embodiment is formed of a voltage controlled SAW (surface acoustic wave) oscillator using a SAW resonator.

According to the ninth embodiment, because the SAW resonator is used for the voltage controlled oscillating means, it is difficult for the voltage controlled oscillating means to be combined with the secondary vibration excluding the principal vibration, and resonance points do not exist except for a predetermined frequency. Also, when the SAW resonator is used, it is possible to directly obtain a high frequency oscillation signal. Accordingly, a multiplier is not necessary. Therefore, it is possible to obtain an output signal with a small amount of jitter.

The voltage controlled oscillating means in a clock converter according to a tenth embodiment is formed of a voltage controlled crystal oscillator using an AT crystal oscillator.

According to the tenth embodiment, it is possible to obtain the above effect by applying the AT crystal oscillator to the voltage controlled oscillating means.

An electronic apparatus according to an eleventh embodiment includes a clock converter according to each of the above inventions.

According to the eleventh embodiment, even though a clock signal with a large amount of jitter is input, it is possible to supply a stabilized clock signal of high frequency with a very small amount of jitter to a multiplexer of an optical transceiver module by using the clock converter according to each of the above embodiments for the optical transceiver module. Accordingly, it is possible to prevent the wrong operation of the transmission data of the multiplexer because a timing margin is secured between a clock signal and the transmission data multiplexed in the multiplexer. Also, it is possible to easily secure a stable operation in a high speed network system represented by a 10 gigabit network system, which is capable of transmitting a large amount of data, such as a moving picture.

DETAILED DESCRIPTION

Figure 1A:
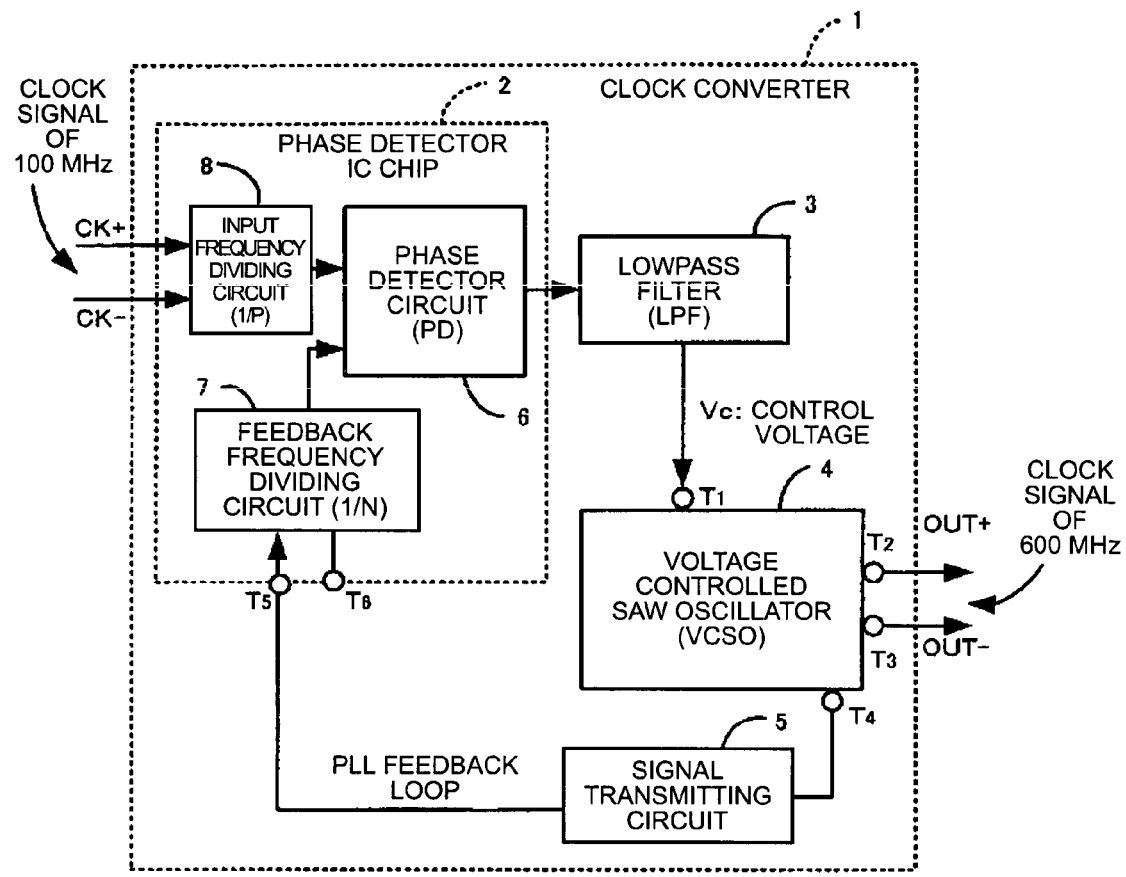
FIG. 1(a) is a block diagram illustrating the structure of a clock converter according to an embodiment of the present invention.

First, a clock converter according to the present invention will be described. According to a first characteristic of the clock converter according to the present invention, among two output terminals of the buffer circuit forming a portion of the positive feedback loop using a voltage controlled phase shifting means in a VCO, one is used for a PLL feedback loop and the other is used for the positive feedback loop. Accordingly, only one wiring line is necessary for the PLL feedback loop. Also, the PLL feedback loop from the output circuit of the clock converter is not necessary. Therefore, the signal of the PLL feedback loop does not change according to a load.

According to a second characteristic of the clock converter according to the present invention, a PECL using an ECL line receiver is used as a differential buffer circuit for the positive feedback loop of the VCO. Furthermore, when a PLL feedback signal is transmitted from the PECL of the VCO to the PECL of a feedback frequency dividing circuit in a phase detector IC chip using the PLL feedback loop, a wiring pattern is formed on the substrate of high permittivity, and a bypass capacitor is added around the input terminal of the PECL of the feedback frequency dividing circuit, to which a high frequency signal is input. Accordingly, a capacitor (a first capacitor) with a small capacitance is formed between the wiring pattern formed on the substrate of high permittivity and the pattern (hereinafter, referred to as beta pattern) formed on the overall surface of the other surface of the substrate. It is possible to remove high frequency noise through the capacitor and to remove low frequency noise by the previously added bypass capacitor.

According to a third characteristic of the clock converter according to the present invention, when the PLL feedback signal is transmitted from the PECL of the VCO to the differential CMOS circuit of the feedback frequency dividing circuit in the phase detector IC chip using the PLL feedback loop, an AC coupling capacitor is interposed into the PLL feedback loop and the line pattern of the PLL feedback loop is formed of fine wiring lines to form a high impedance line. Furthermore, efforts are made to reduce power consumption by increasing the bias resistance of the PECL of the VCO and to increase the amplitude of an input signal by increasing the bias resistance of the differential CMOS circuit of the feedback frequency dividing circuit.

When the frequency band of a clock signal is no more than 100 MHz, a VCXO mounted with the AT crystal oscillator (a high frequency crystal oscillator) by a flat crystal chip is used as the VCO that becomes the oscillation source of the clock converter. When the frequency band of the clock signal is 100 to 200 MHz, the VCXO using the AT crystal oscillator or mesa and reverse mesa crystal oscillators is used as the VCO.

Furthermore, when the frequency band of the clock signal is no less than 200 MHz, a voltage controlled SAW oscillator (VCSO) mounted with the SAW resonator using a surface acoustic wave is used as the VCO. Moreover, it is possible to output the clock signal no less than 200 MHz by installing a frequency multiplier in the output step of the VCXO.

The SAW resonator generates a standing wave by arranging an interdigital exciting electrode and a ladder-shaped reflector on a piezo-electric substrate and by reflecting the surface wave excited by the exciting electrode to the reflector, and thus functions as a resonator. Because the oscillation energy of the SAW resonator is localized on the surface of the SAW resonator and is not fully combined with secondary vibration excluding principal vibration, the SAW resonator has a resonation point only in a predetermined frequency, compared to the AT crystal oscillator. Furthermore, it is possible to directly obtain a high frequency oscillation signal by the VCSO using the SAW resonator. Accordingly, a multiplexer is not necessary. Therefore, it is possible to obtain an output signal with a small amount of jitter, compared to the VCXO using the AT crystal oscillator.

Because the frequency precision of the clock signal is compared to each other on the basis of a relative change amount ($\Delta f/f \times 10^{-6}$) of a frequency deviation for long-term precision degrees caused by a secular change, the frequency precision does not change even though the frequency of the clock signal increases. However, the frequency precision for a short time caused by jitter where a frequency changes due to a temperature drift or load capacity is compared to each other by the absolute value (picosecond) of a frequency change amount in a time axis. Therefore, the frequency precision tends to deteriorate as the frequency of the clock signal is in a high frequency band. When the frequency of the clock signal is no less than 200 MHz, efforts are made to improve the frequency precision for a short time commonly using the VCSO formed of the SAW resonator with a small amount of jitter.

Figure 1B:
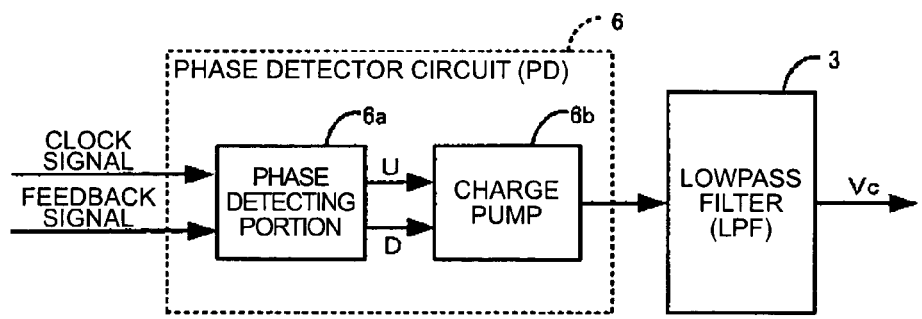
FIG. 1(b) is a block diagram illustrating the internal structure of a phase detector circuit.

Therefore, according to the embodiments of the present invention described hereinafter, a clock converter using a VCSO with a small amount of jitter and a high frequency precision for a short time will be described. FIG. 1(a) is a block diagram illustrating the structure of a clock converter according to an embodiment of the present invention. FIG. 1(b) is a block diagram illustrating the internal structure of a phase detector circuit. A clock converter 1 illustrated in FIG. 1(a) includes a phase detector IC chip 2, a LPF (low pass filter) 3, a VCSO (voltage controlled SAW oscillator) 4 and a signal transmitting circuit 5.

The phase detector IC chip 2, an IC block includes a phase detector circuit (PD) 6, a feedback frequency dividing circuit (1/N) 7 and an input frequency dividing circuit (1/P) 8. Furthermore, the phase detector circuit 6 includes a phase detecting portion 6a and a charge pump 6b as shown in FIG. 1(b). In such a constitution, for example, clock signals CK+ and CK− input to the clock converter 1 by 100 MHz are multiplied to clock signals OUT+ and OUT− of 600 MHz and are output. Also, the clock converter 1 according to the present invention is mounted on the substrate of, for example, about 15 mm×15 mm. In addition, the frequency of an input clock signal may be equal to the frequency of an output clock signal.

The functions of the elements directly related to the present invention will now be described. The VCSO 4, an oscillator using a SAW resonator controls the phase in the oscillator by a controlled voltage Vc from the outside to be suitable for the frequency of an oscillation signal and generates the clock signal of a predetermined frequency. An output terminal T4 is a PLL feedback loop output terminal for transmitting a PLL feedback signal from the differential buffer circuit for the positive feedback loop of the VCSO 4. The PLL feedback signal is transmitted from the output terminal T4 to the phase detector IC chip 2 through the signal transmitting circuit 5.

The signal transmitting circuit 5 is an interface circuit positioned between the output terminal T4 for the PLL feedback loop of the VCSO 4 and the input terminal T5 of the feedback frequency dividing circuit 7 in the phase detector IC chip 2 and has a function of effectively inputting and outputting a high frequency signal between the VCSO 4 and the feedback frequency dividing circuit (1/N) of the phase detector IC chip 2. The signal transmitting circuit 5 takes the impedance matching of the PLL feedback loop or determines the bias voltage of the phase detector circuit 6 in the phase detector IC chip 2.

In the phase detector circuit 6, as illustrated in FIG. 1(b), the phase detecting portion 6a compares the phase of the PLL feedback signal input through the feedback frequency dividing circuit (1/N) 7 in the PLL feedback loop with the phase of the clock signal input from the outside through the input frequency dividing circuit (1/P) 8, generates up down signals U and D on the basis of the phase difference and transmits to a charge pump 6b. The charge pump 6b performs analogue control by the up down signals U and D, outputs the comparison result of the phase detecting portion 6a, and transmits the comparison result to the LPF 3. That is, the phase detector circuit 6 outputs the phase difference signal corresponding to the phase difference between the PLL feedback signal and the input clock signal to the LPF 3.

The LPF 3 removes the noise generated by the differential operation of the phase detector circuit 6 and transmits the controlled voltage Vc suitable for the phase difference between the clock signal and the PLL feedback signal to the voltage controlled phase shifting circuit 14 (see FIG. 2) of the VCSO4.

In addition, the feedback frequency dividing circuit (1/N) 7 is a frequency divider for dividing the frequency of the PLL feedback signal from the PLL feedback loop to be adjusted to the output frequency from the input frequency dividing circuit (1/P) 8. Furthermore, the input frequency dividing circuit (1/P) 8 is a frequency divider for dividing the frequency of the input clock signal and inputting it to the phase detector circuit 6.

Figure 2:
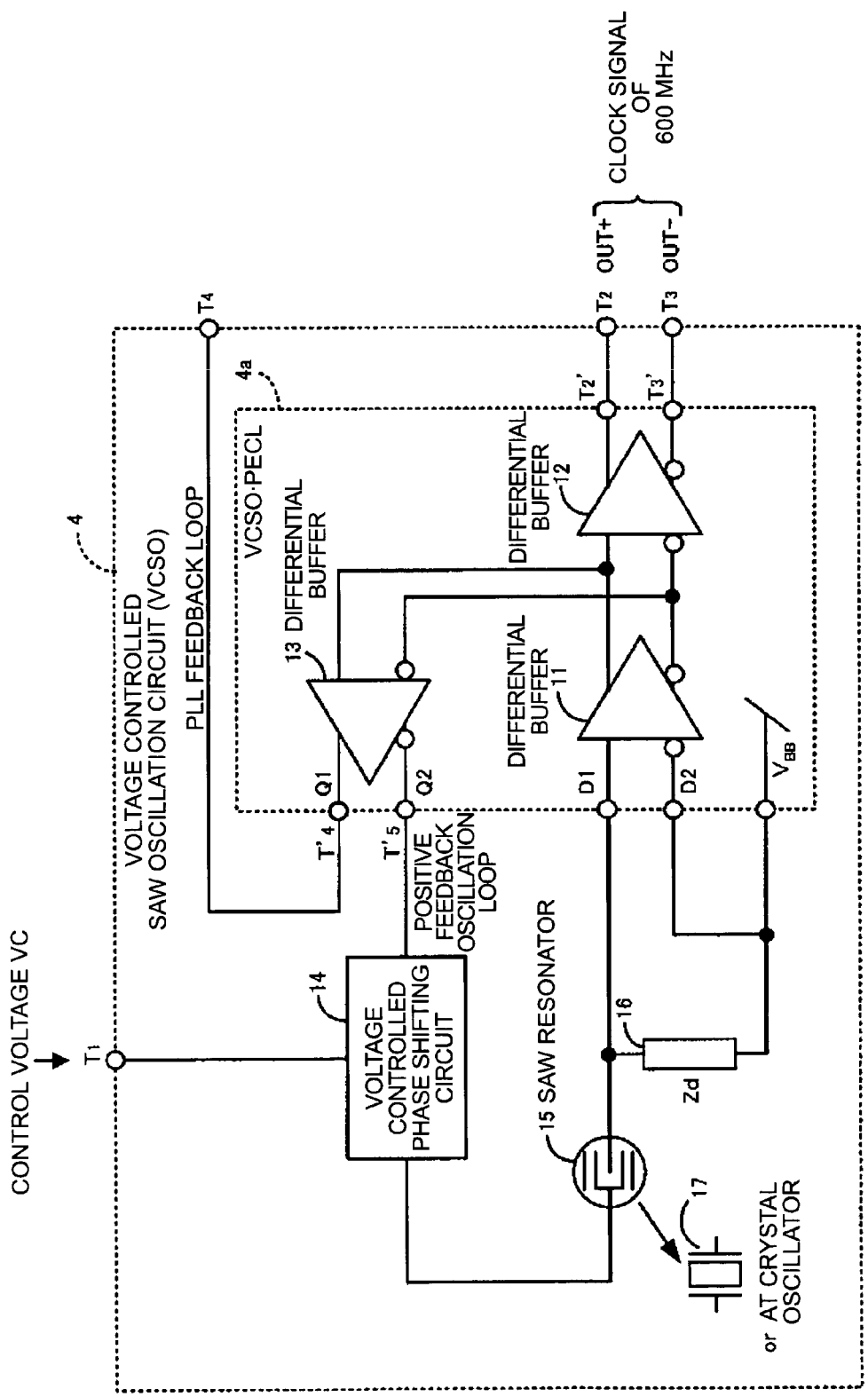
FIG. 2 is a block diagram illustrating the structure of a VCSO in the clock converter illustrated in FIG. 1.

FIG. 2 is a block diagram illustrating a structure of the VCSO in the clock converter illustrated in FIG. 1. The VCSO 4 includes a VCO·PECL 4a where differential buffers 11, 12 and 13 are formed of IC chips, a voltage controlled phase shifting circuit 14 for performing phase shift by a variable capacitance diode, a SAW resonator 15 for generating oscillation by an surface acoustic wave, and an impedance Zd 16 for applying a bias voltage between the input terminals of the differential buffer (buffer means) 11. Also, the voltage controlled phase shifting circuit 14 changes the reactance of the diode of variable capacitance (not shown) by applying the controlled voltage Vc to the terminal Ti, to thus perform phase shift and controls the phase of the resonance signal of the SAW resonator 15 so that the phase difference between the input signal (a clock signal) from the outside and the PLL feedback signal becomes zero.

The resonance signal output from the SAW resonator 15 is input to the differential buffer 11 as a voltage signal level generated on both ends of the impedance Zd 16. Furthermore, the output signal of the differential buffer 11 is transmitted as a group of clock signals OUT+ and OUT− through the differential buffer 12. The output signal of the differential buffer 11 is input to the differential buffer (buffer means) 13. A positive feedback signal Q2 whose phase is different from the phase of the resonance signal of the SAW resonator 15 by 180° is input from one output terminal T'5 of the differential buffer 13 to the voltage controlled phase shifting circuit 14. Accordingly, the voltage controlled phase shifting circuit 14 shifts the phase of the input positive feedback signal Q2 by the control voltage Vc and the SAW resonator 15 is oscillated at high frequency. Accordingly, it is possible to output the clock signals OUT+ and OUT− of, for example, 600 MHz from the output terminals T2 and T3.

Meanwhile, a PLL feedback signal Q1 with the same phase as that of the resonance signal of the SAW resonator 15 is output from the other output terminal T'4 of the differential buffer 13. The PLL feedback signal Q1 is fed back from the output terminal T4 of the VCSO 4 to the input terminal T5 of the feedback frequency dividing circuit 7 of the phase detector IC chip 2 through the signal transmitting circuit 5 as illustrated in FIG. 1.

Figure 3:
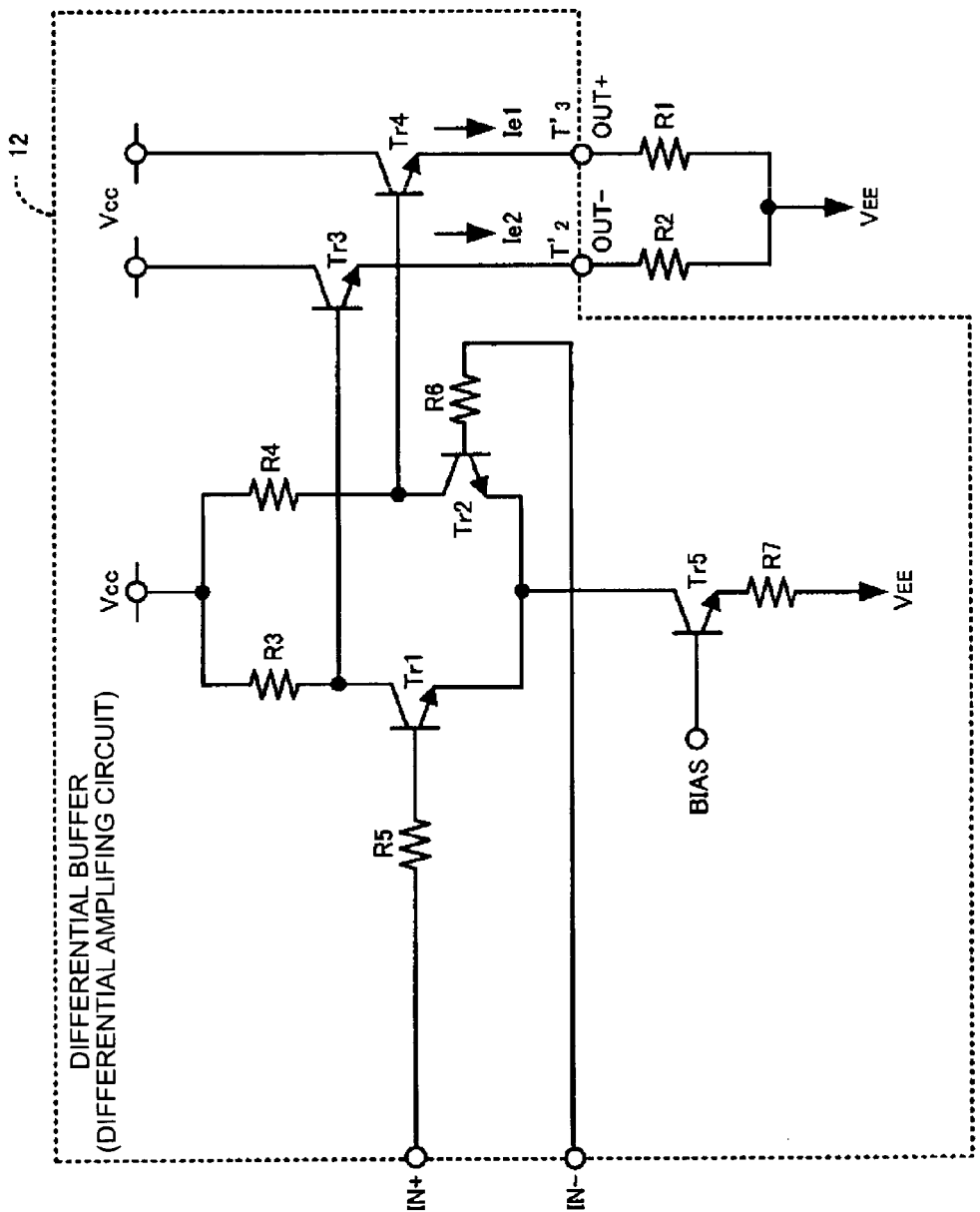
FIG. 3 is a circuit diagram of a differential amplifying circuit illustrating the specific structure of the differential buffers 11, 12 and 13 illustrated in FIG. 2.

FIG. 3 is a circuit diagram of a differential amplifying circuit illustrating a specific structure of the differential buffers 11, 12 and 13 illustrated in FIG. 2. That is, each of the differential buffers 11, 12 and 13 is formed of an emitter open type differential amplifying circuit called an ECL line receiver (hereinafter, a differential ECL amplifying circuit). Also, the differential amplifying circuit of FIG. 3 illustrates the differential amplifying circuit of the differential buffer 12 in the VCSO·PECL 4a of FIG. 2. Externally attached resistors R1 and R2 are connected to the output terminals T'2 and T'3, respectively (in the case of the differential buffer 13, the resistors R1 and R2 are connected to the output terminals T'4 and T'5, respectively).

Because the differential amplifying circuit illustrated in FIG. 3 is a common circuit, a detailed description of the operation thereof is omitted. However, transistors Tr1 and Tr2 repeat a differential reversing operation by input signals IN+ and IN− whose phases are different from each other by 180°. Accordingly, it is possible to output the differential signal more amplified and waveform-shaped than the output signal OUT− of a transistor Tr3 and the output signal OUT+ of a transistor Tr4. Also, a transistor Tr5 is means for variably setting the bias level of an oscillation signal.

It is possible to easily integrate the differential buffer of the VCSO·PECL forming the VCO as an IC and to simplify the structure of the differential buffer by using the ECL line receiver for the differential buffers 11, 12 and 13.

That is, according to a characteristic of the clock converter of the present invention, as illustrated in FIG. 2, between the two output terminals of the differential buffer 13, one output terminal is used for the positive feedback loop, and the other output terminal is used for the PLL feedback loop. A few embodiments will now be described for the signal transmitting circuit 5 of the PLL feedback loop for feeding back the PLL feedback signal from the differential ECL amplifying circuit (hereinafter, referred to as PECL) forming the differential buffer 13 to the input step of the feedback frequency dividing circuit 7 of the phase detector IC chip 2. The signal transmitting circuit 5 will be described with reference to the following two examples according to whether the differential amplifying circuit of the feedback frequency dividing circuit 7 is the differential ECL amplifying circuit (PECL) or the differential CMOS circuit.

FIRST EXAMPLE

Figure 4:
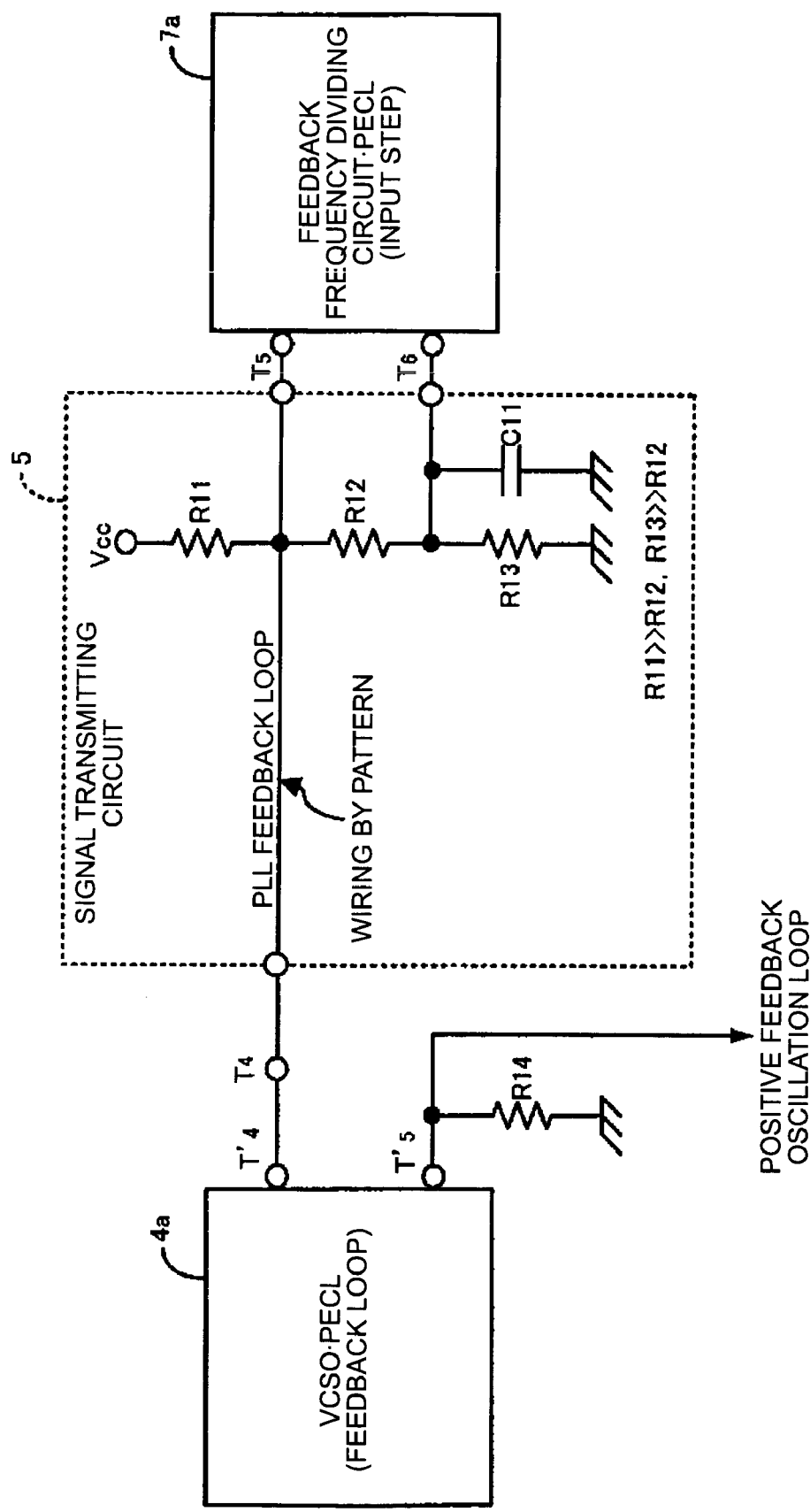
FIG. 4 is a block diagram of a signal transmitting circuit between the PECL of the output step of the VCSO and the PECL of the input step of the feedback frequency dividing circuit of the phase detector IC chip in the clock converter 1 illustrated in FIG. 1.

The signal transmitting circuit in cases where the differential amplifying circuit of the VCSO is the PECL and the differential amplifying circuit of the feedback frequency dividing circuit 7 is the PECL circuit will be described. FIG. 4 is a block diagram of a signal transmitting circuit inserted between the PECL of the output step of the VCSO and the PECL of the input step of the feedback frequency dividing circuit 7 of the phase detector IC chip in the clock converter 1 illustrated in FIG. 1. That is, the signal transmitting circuit 5 is the interface for forming the PLL feedback loop between the output terminal T4 of the PECL of the output step of the VCSO (the VCSO·PECL 4a) and the input terminal T5 of the PECL (the feedback frequency dividing circuit·PECL 7a) of the input step of the feedback frequency dividing circuit 7 in the phase detector IC chip, which is composed of the substrate made of a high dielectric material and having a narrow wiring pattern thereon so as to have the reference impedance of 50 Ω.

Furthermore, the voltage applied to the input terminals T5 and T6 of the feedback frequency dividing circuit·PECL 7a, to which a high frequency signal is input, is divided by connecting in series three bias resistors R11, R12 and R13. That is, one end of the bias resistor R11 (the first resistor) is connected to the power source voltage Vcc. One end of the bias resistor R13 (the third resistor) is connected to ground, and both ends (a first connection point and a second connection point) of the bias resistor R12 (the second resistor) positioned between the bias resistor R11 and the bias resistor R13 is connected to the input terminals T5 (the first input terminal) and T6 (the second input terminal) of the feedback frequency dividing circuit·PECL 7a. A capacitor C11 (a first capacitor) for removing low frequency noise is connected between the input terminal T6 of the feedback frequency dividing circuit·PECL 7a and the ground (that is, the capacitor C11 is connected parallel to the bias resistor R13). It is preferable that the capacitor C11 is directly connected to the input terminal T6. Furthermore, the output terminal T'5 of the VCSO·PECL 4a where the PLL feedback loop is not formed is connected to ground through the resistor R14 and is connected to the voltage controlled phase shifting circuit 14 as the positive feedback loop, as illustrated in FIG. 2.

R12 is determined such that R11>>R12 and R13>>R12 are established in the relationship among the three bias resistors R11, R12 and R13, wherein the resistor R12 is positioned between the resistors R11 and R13 to bias the input terminals T5 and T6. For example, when R11=4.3 kΩ, R13=2.7 kΩ and R12=100 Ω, it is possible to let the input impedance to the feedback frequency dividing circuit 7 have a value of 50 Ω. Accordingly, it is possible to stabilize the differential operation of the differential amplifying circuit of the feedback frequency dividing circuit·PECL 7a and the VCSO·PECL 4a by making the voltage levels of the differential input signals of the input terminals T5 and T6 of the feedback frequency dividing circuit·PECL 7a nearly the same and matching the impedance of the input terminal T5 with the impedance of the PLL feedback loop.

Furthermore, the substrate of high permittivity, such as a glass fabric based high permittivity modified epoxy resin, is used as the substrate of the signal transmitting circuit, on which the wiring pattern 5 is formed. For example, the MCL-HD-67 (the registered trademark) manufactured by Hitachi is a substrate material of high permittivity. The relative dielectric constant ∈ of the substrate material is about 10.4 as a typical value. However, in general, a substrate whose relative dielectric constant ∈ is no less than 4 is preferably used. It is possible to form the PLL feedback loop with low impedance of about 50 Ω by a wiring pattern with a narrow line width by using such a substrate of high permittivity.

Figure 5:
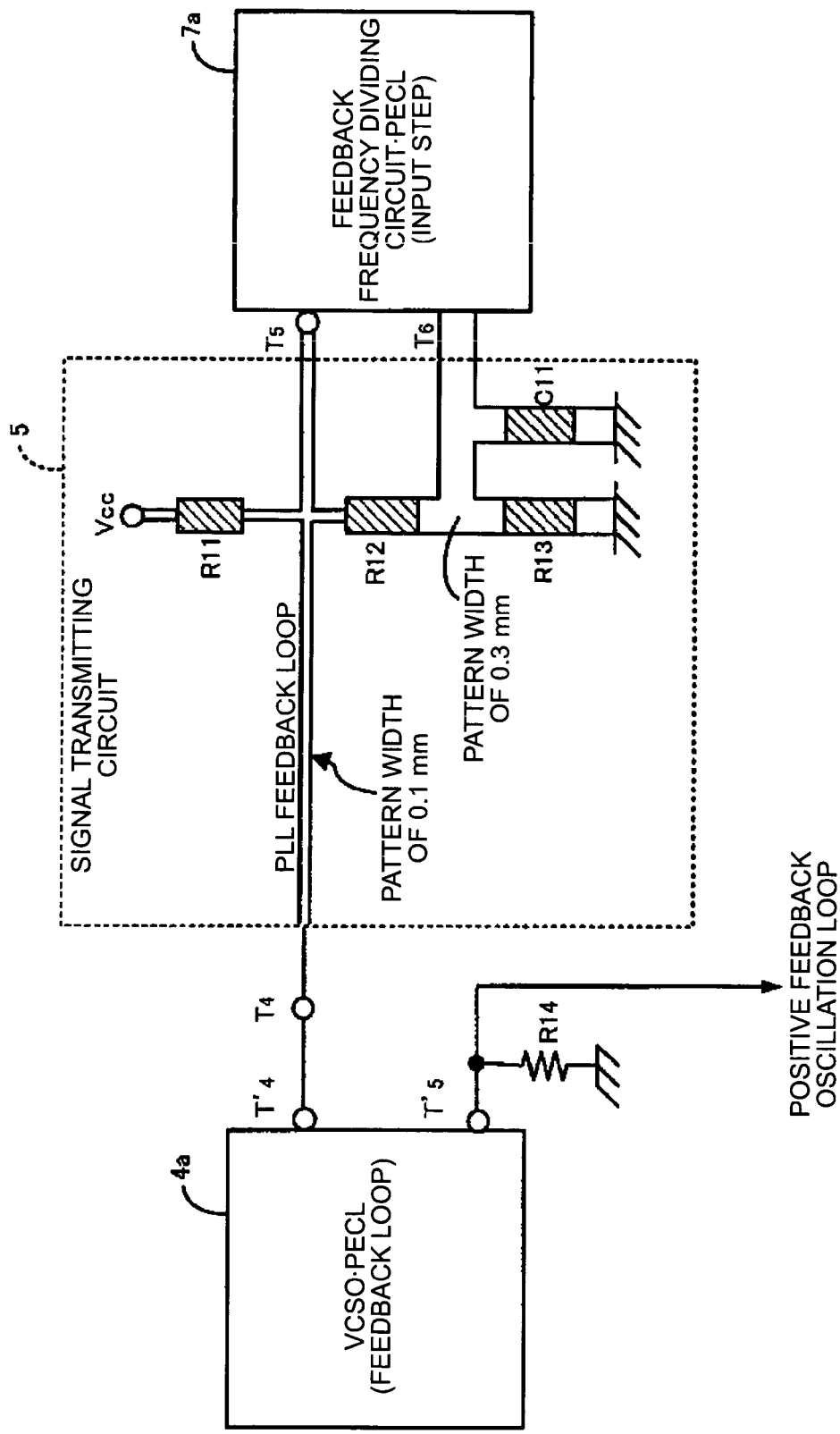
FIG. 5 is a view illustrating a wiring pattern on the substrate of the signal transmitting circuit illustrated in FIG. 4.

FIG. 5 is a view illustrating a wiring pattern on the substrate of the signal transmitting circuit 5 illustrated in FIG. 4. As illustrated in FIG. 5, the width of the wiring pattern of the PLL feedback frequency loop between the output terminal T4 of the VCSO·PECL 4a and the input terminal T5 of the feedback frequency dividing circuit·PECL 7a is, for example, 0.1 mm. The width of the wiring pattern of the discrete parts, such as the resistors R12 and R13 and the capacitor C11, connected to the ground of the feedback frequency dividing circuit·PECL 7a is, for example, 0.3 mm.

Meanwhile, the beta pattern formed on the overall surface of the other surface of the substrate is grounded. Therefore, it is possible to form a capacitor (a first capacitor) of a desired capacitance between the ground and the wiring pattern of the discrete parts R12, R13 and C11 by increasing the line width of the ground side of the discrete parts R12, R13 and C11 up to 0.3 mm. Accordingly, it is possible to remove high frequency noise. That is, because the externally attached capacitor C11 for removing the low frequency noise has a relatively large capacitance of about 10,000 pF, it is possible to remove the low frequency noise. Because the capacitor formed between the wiring pattern and the ground has a capacitance of about 3 pF, it is possible to remove the high frequency noise of several hundred megahertz.

Figure 6:
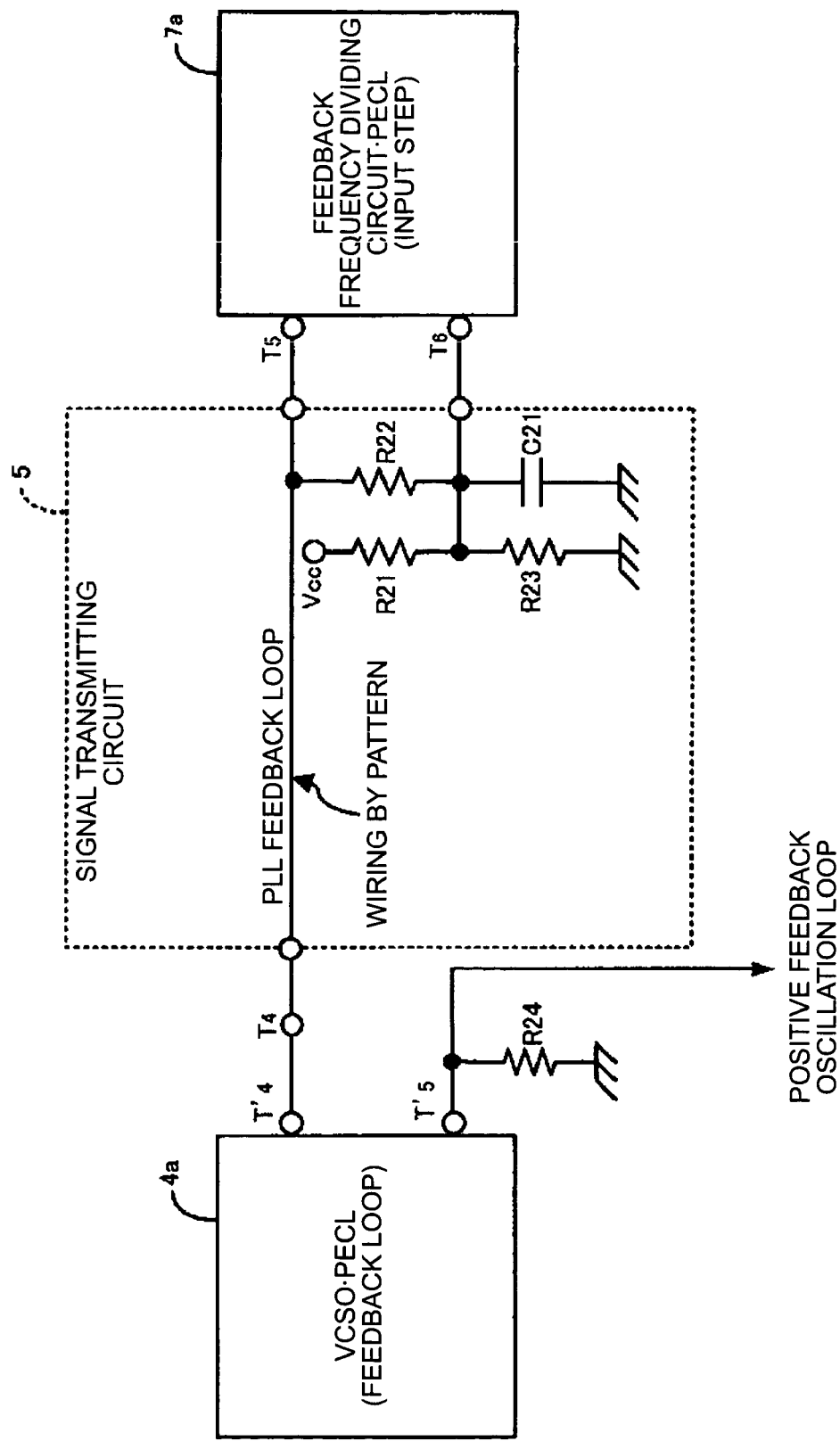
FIG. 6 is another block diagram of the signal transmitting circuit between the PECL of the output step of the VCSO and the PECL of the input step of the feedback frequency dividing circuit of the phase detector IC chip in the clock converter 1 illustrated in FIG. 1.

FIG. 6 is another block diagram of a signal transmitting circuit between the PECL of the output step of the VCSO and the PECL of the input step of the feedback frequency dividing circuit of the phase detector IC chip in the clock converter 1 illustrated in FIG. 1. That is, the embodiment of FIG. 6 is identical with the embodiment of FIG. 4 in the wiring pattern of the PLL feedback loop. However, the embodiment of FIG. 6 is different from the embodiment of FIG. 4 in the structure of the voltage dividing resistance of the feedback frequency dividing circuit·PECL 7a. In the embodiment of FIG. 6, a resistor R22 is connected between the input terminal T5 and the input terminal T6 of the feedback frequency dividing circuit·PECL 7a. In addition, the voltage between Vcc and ground is divided by two bias resistors R21 and R23, and the input terminal T6 is connected between resistors R21 and R23. Furthermore, a capacitor C21 for removing low frequency noise is connected between the input terminal T6 and the ground. It is possible to match the impedance of the input terminal T5 of the feedback frequency dividing circuit·PECL 7a with 50 Ω of the PLL feedback loop although the discrete parts of the input step of the feedback frequency dividing circuit·PECL 7a are formed as illustrated in FIG. 6. Moreover, the circuit connected to the terminal of the VCSO·PECL 4a where the PLL feedback loop is not formed has the same structure as that of illustrated in FIG. 4.

SECOND EXAMPLE

Figure 7:
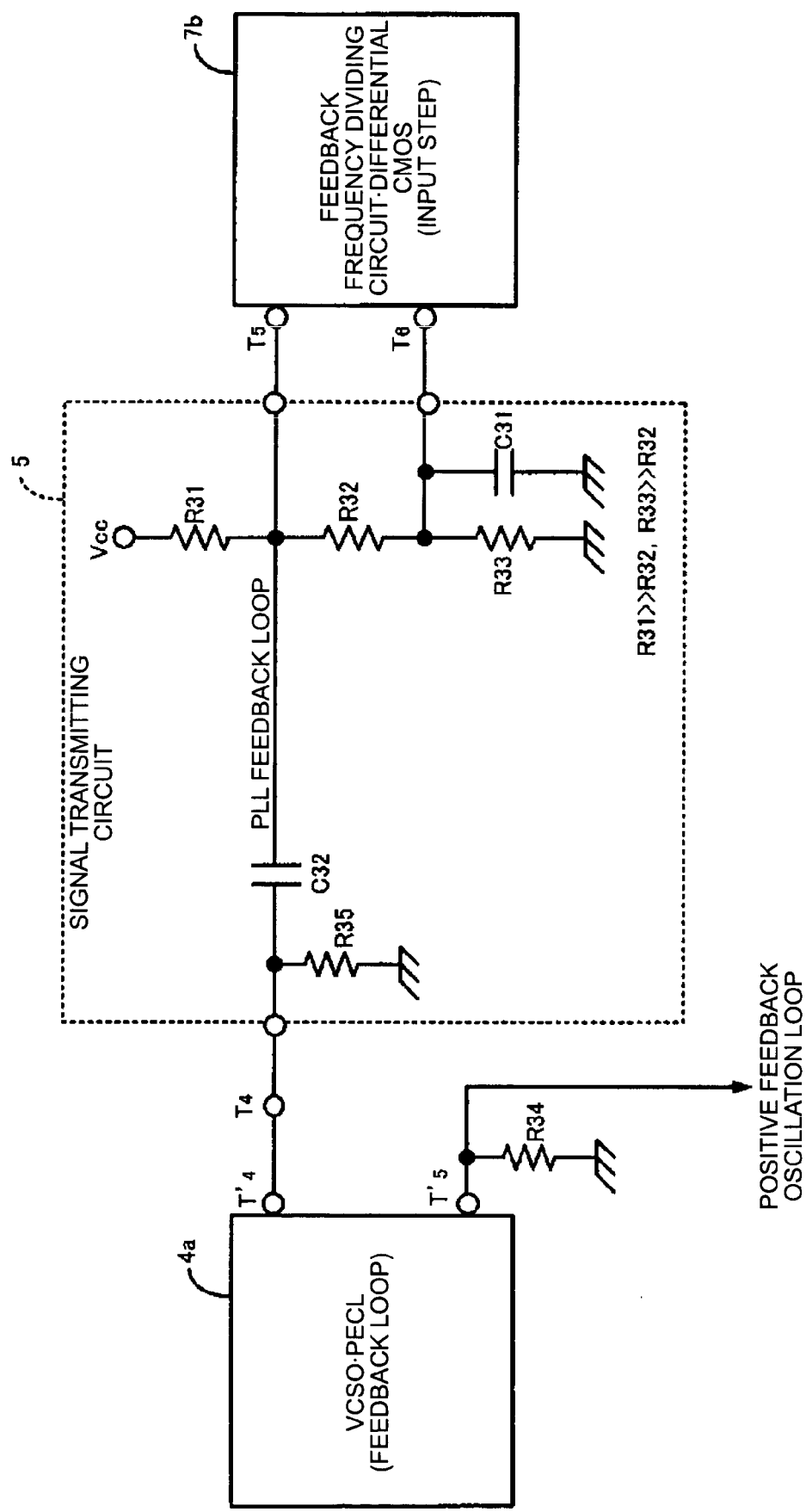
FIG. 7 is a block diagram of the signal transmitting circuit between the PECL of the output step of the VCSO and the differential CMOS of the input step of the feedback frequency dividing circuit of the phase detector IC chip in the clock converter illustrated in FIG. 1.

A signal transmitting circuit in cases where the differential amplifying circuit of the VCSO is the PECL and the differential amplifying circuit of the feedback frequency dividing circuit 7 is the CMOS circuit will now be described. FIG. 7 is a block diagram of the signal transmitting circuit inserted between the PECL of the output step of the VCSO and the differential CMOS of the input step of the feedback frequency dividing circuit of the phase detector IC chip in the clock converter shown in FIG. 1. The signal transmitting circuit of FIG. 7 illustrates the interface between the VCSO·PECL 4a of the output step of the VCSO 4 and the feedback frequency dividing circuit·differential CMOS 7b of the input step of the feedback frequency dividing circuit 7. One PLL feedback loop between the output terminal T4 of the VCSO·PECL 4a and the input terminal T5 of the feedback frequency dividing circuit·differential CMOS 7b is coupled through an AC coupling capacitor C32 (a second capacitor).

Because the PLL feedback loop for connecting the VCSO·PECL 4a with the feedback frequency dividing circuit·differential CMOS 7b is a high impedance line, efforts are made to increase impedance by forming a wiring pattern with extremely fine line width on the substrate of high permittivity. That is, because the differential amplifying circuit of the feedback frequency dividing circuit 7 is formed of the differential CMOS circuit, the input impedance of the differential amplifying circuit is high. Therefore, it is possible to adjust (convert) the impedance between an input and an output by reducing the line width of the wiring pattern of the PLL feedback loop at the input side of the feedback frequency dividing circuit 7 to minimize the substrate and by increasing the impedance.

In addition, the structure of dividing the voltage applied between the input terminals T5 (the first input terminal) and T6 (the second input terminal) of the feedback frequency dividing circuit·differential CMOS 7b by three bias resistors R31 (the first resistor), R32 (the second resistor) and R33 (the third resistor) and the structure of connecting the capacitor C31 (the first capacitor) for removing low frequency noise to ground are the same as the structure between the PECL and the PECL illustrated in FIG. 4. Furthermore, the resistor R32 is determined to be lower than the resistors R31 and R33 such that R31>>R32 and R33>>R32 are established in the relationship among the three bias resistors R31, R32 and R33 with the center resistor R32 and the resistors R31 and R33 connected to both ends (a first connection point and a second point) of the resistor R32, like in the case of FIG. 4. Because the differential CMOS is the wiring pattern of the PLL feedback loop and has high impedance, the resistance values of the bias resistors R31, R32 and R33 are higher than those of the PECL shown in FIG. 4. For example, R31=43 kΩ, R33=27 kΩ and R32=500 Ω to 1 kΩ.

That is, because the input impedance of the feedback frequency dividing circuit·differential CMOS 7b is higher than the input impedance of the feedback frequency dividing circuit·PECL 7a illustrated in FIG. 4, 50 Ω, the impedance between an input and an output is adjusted (converted) by letting the bias resistor R32 have the resistance value of 500 Ω to 1 kΩ higher than 100 Ω. As a result, it is possible to increase the amplitude of the input signal of the feedback frequency dividing circuit·differential CMOS 7b and to increase the impedance. Accordingly, the PLL feedback signal is made with steep inclines and declines. Therefore, it is possible to stabilize the differential operation of and to prevent the wrong operation of the feedback frequency dividing circuit·differential CMOS 7b.

Figure 12:
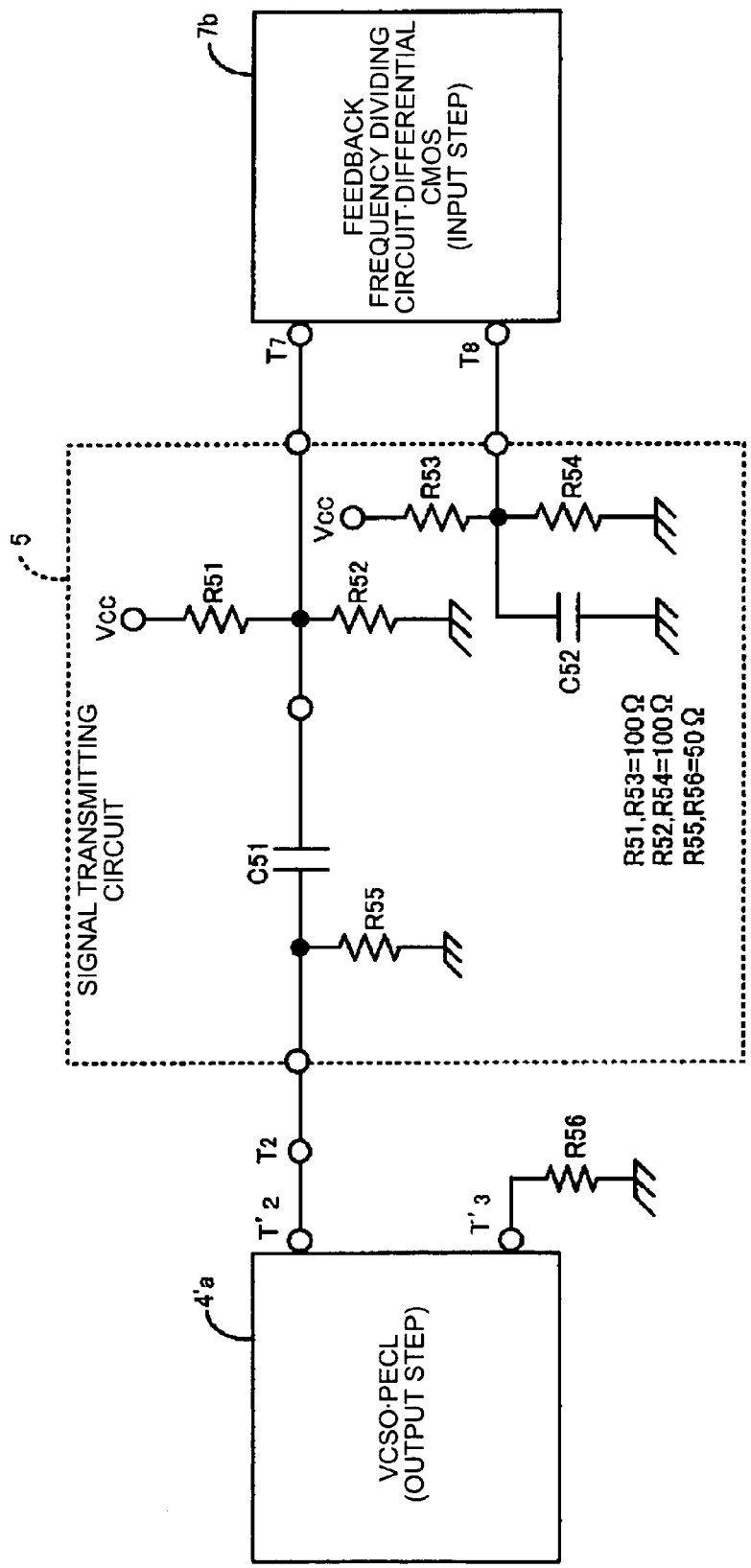
FIG. 12 is a block diagram of the conventional signal transmitting circuit between the PECL of the output step of the VCO and the differential CMOS of the input step of the feedback frequency dividing circuit of the phase detector IC chip in the clock converter illustrated in FIG. 10.

In addition, since the output impedance of the PLL feedback loop is high, it is possible for the termination resistor R35 of the output terminal T4 of the VCSO·PECL 4a to have higher resistance, for example, 500 Ω to 1 kΩ as compared with the termination resistor R55 shown in FIG. 12 according to a conventional technology, which has the output impedance of 50 Ω. Accordingly, current flowing through the termination resistor R35 of the VCSO·PECL 4a varies according to a power source voltage, however, the current is significantly reduced to 2.5 to 5 mA. Therefore, the power consumption by the differential ECL amplifying circuit of the VCSO·PECL 4a is suppressed. Accordingly, it is possible to realize the clock converter of low power consumption.

Because the bias voltage of the VCSO·PECL 4a is different from the bias voltage of the feedback frequency dividing circuit·differential CMOS 7b, an AC coupling between the VCSO·PECL 4a and the feedback frequency dividing circuit·differential CMOS 7b is made by the capacitor C32. Furthermore, since the differential amplifying circuit of the VCSO·PECL 4a has an open type emitter structure, a clock signal is output by connecting the termination resistor R35 between the output terminal T4 of the VCSO·PECL 4a and ground and flowing emitter current. At this time, it is possible to increase the resistance value of the termination resistor R35 from 50 Ω according to a conventional technology to 500 Ω to 1 kΩ, 10 to 20 times as large as 50 Ω. Therefore, it is possible to increase the amplitude of the output signal transmitted from the VCSO·PECL 4a (but emitter electric potential is uniform). Furthermore, the emitter current is reduced by increasing the resistance of the termination resistor R35. Accordingly, it is possible to reduce the power consumption by the VCSO·PECL 4a.

Figure 8:
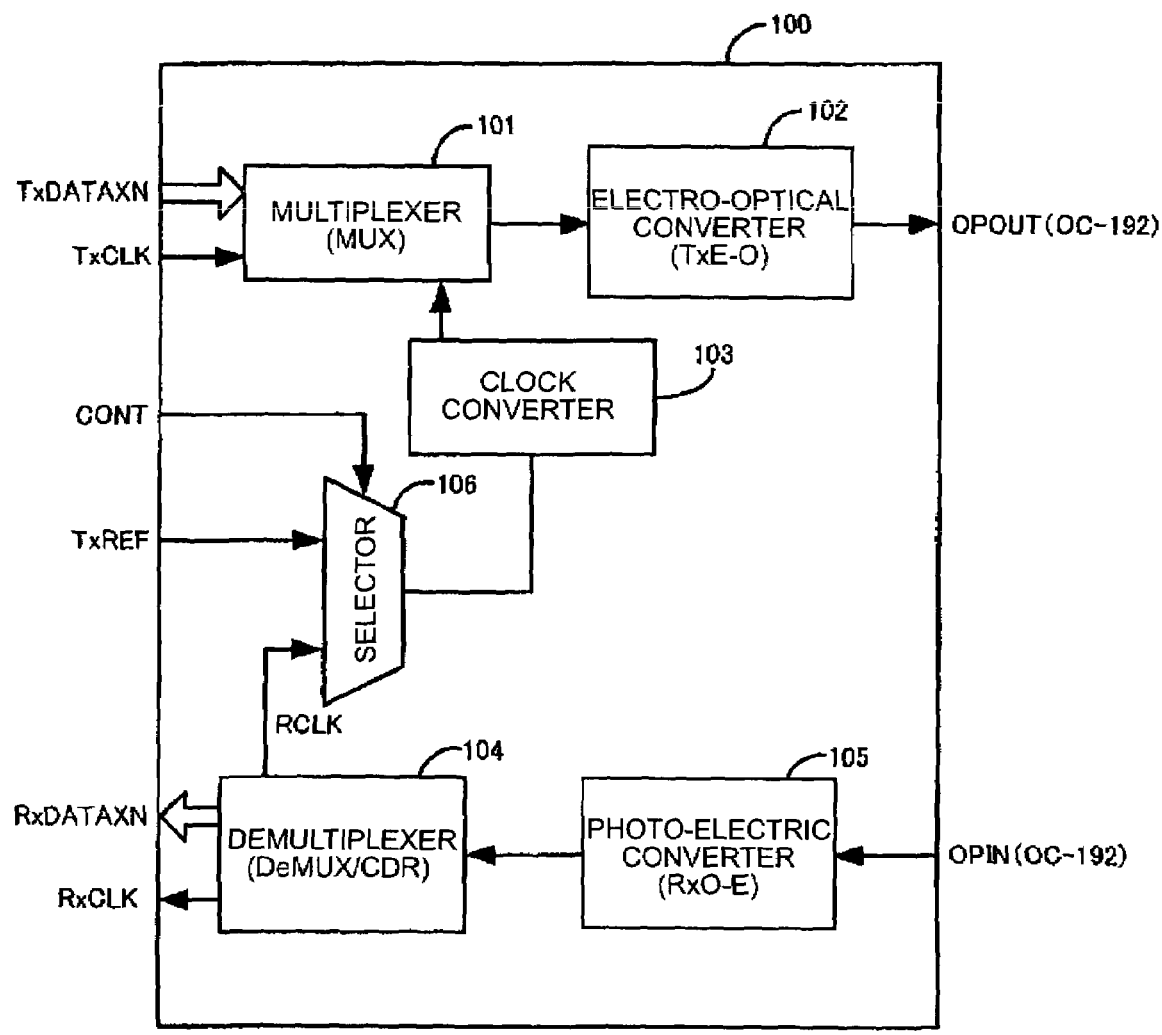
FIG. 8 is a schematic block diagram of an optical interface of 10 gigabit using the clock converter according to the present invention.
Figure 9:
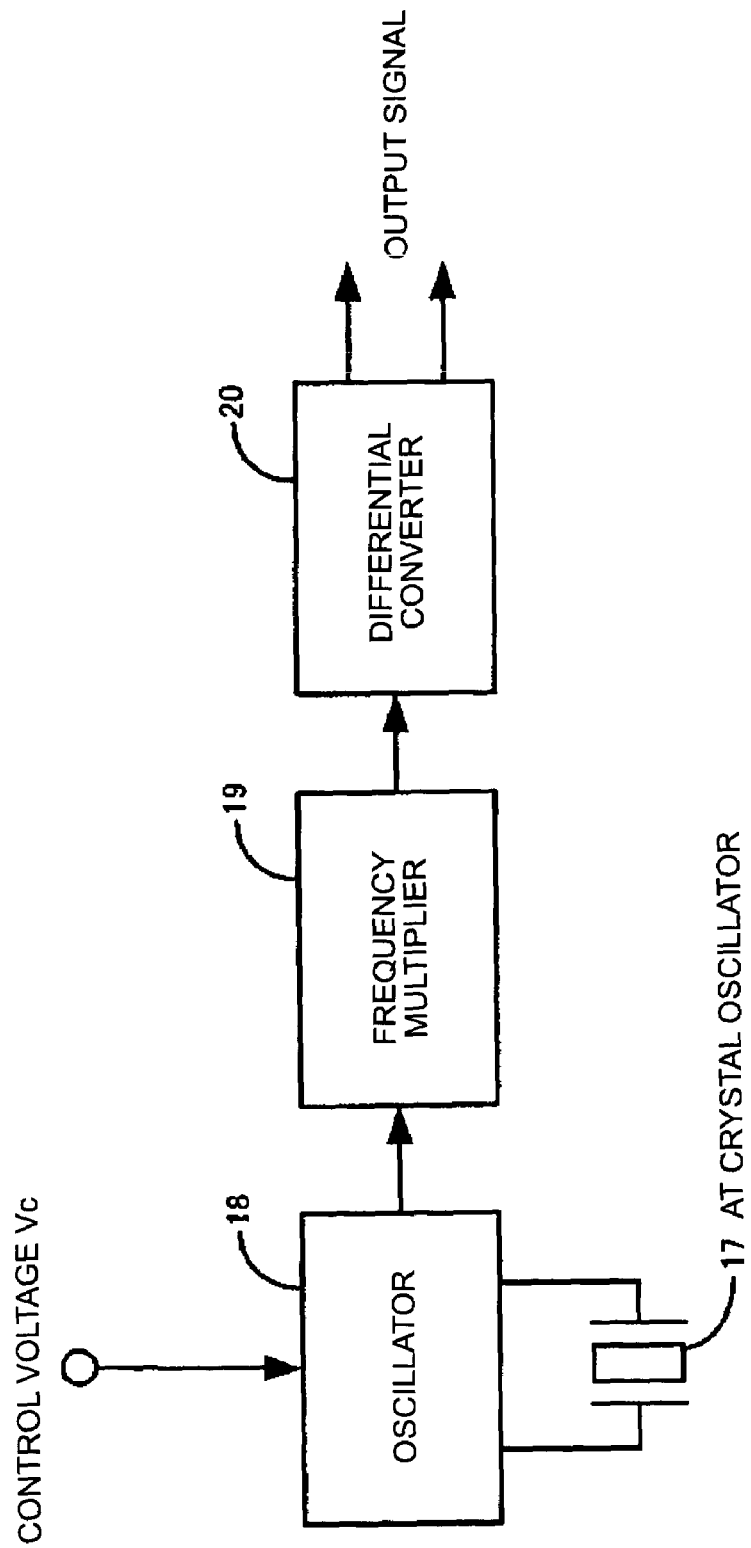
FIG. 9 is a conceptual view illustrating the structure of a common VCXO.
Figure 10:
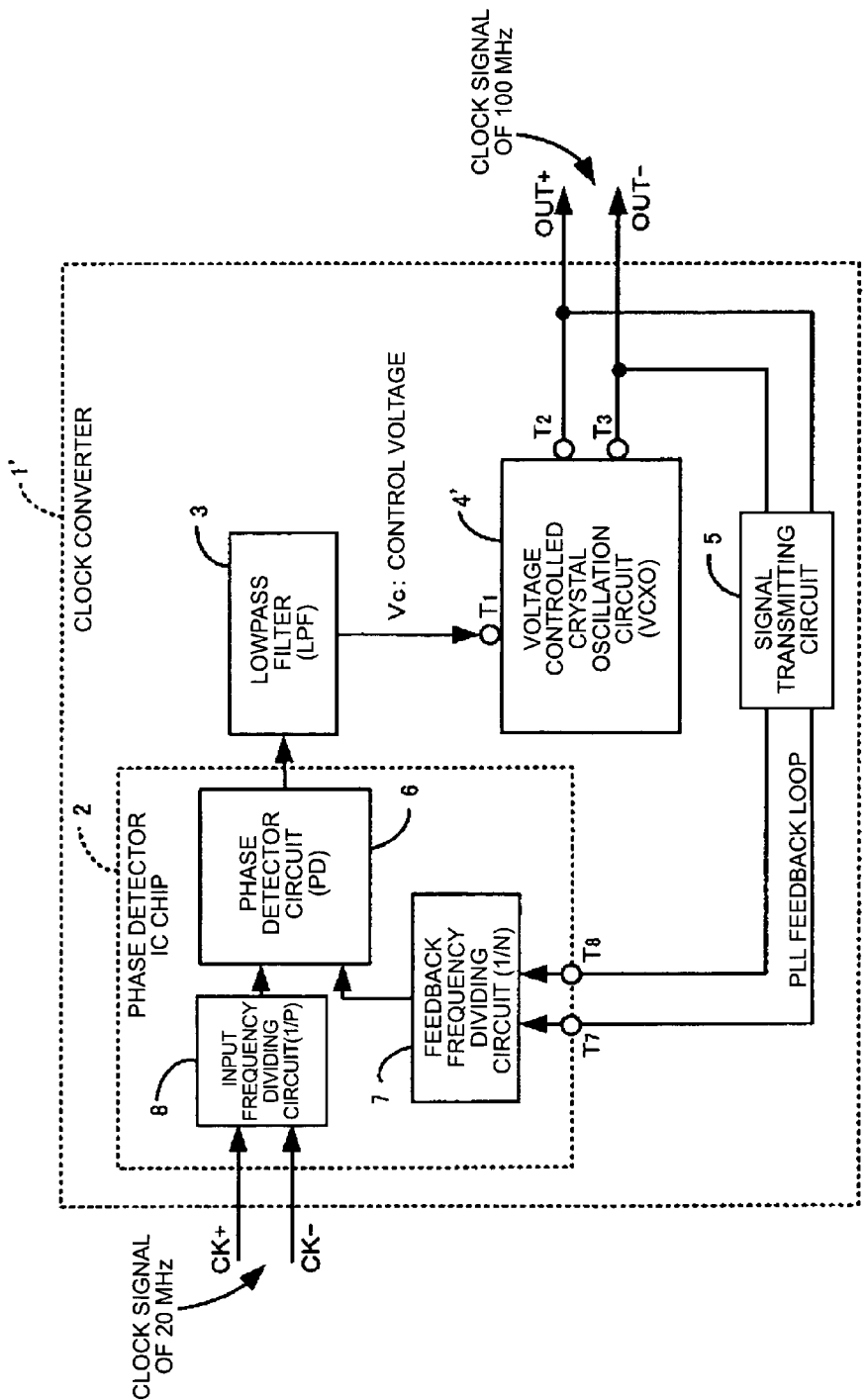
FIG. 10 is a block diagram illustrating the structure of a conventional clock converter.
Figure 11:
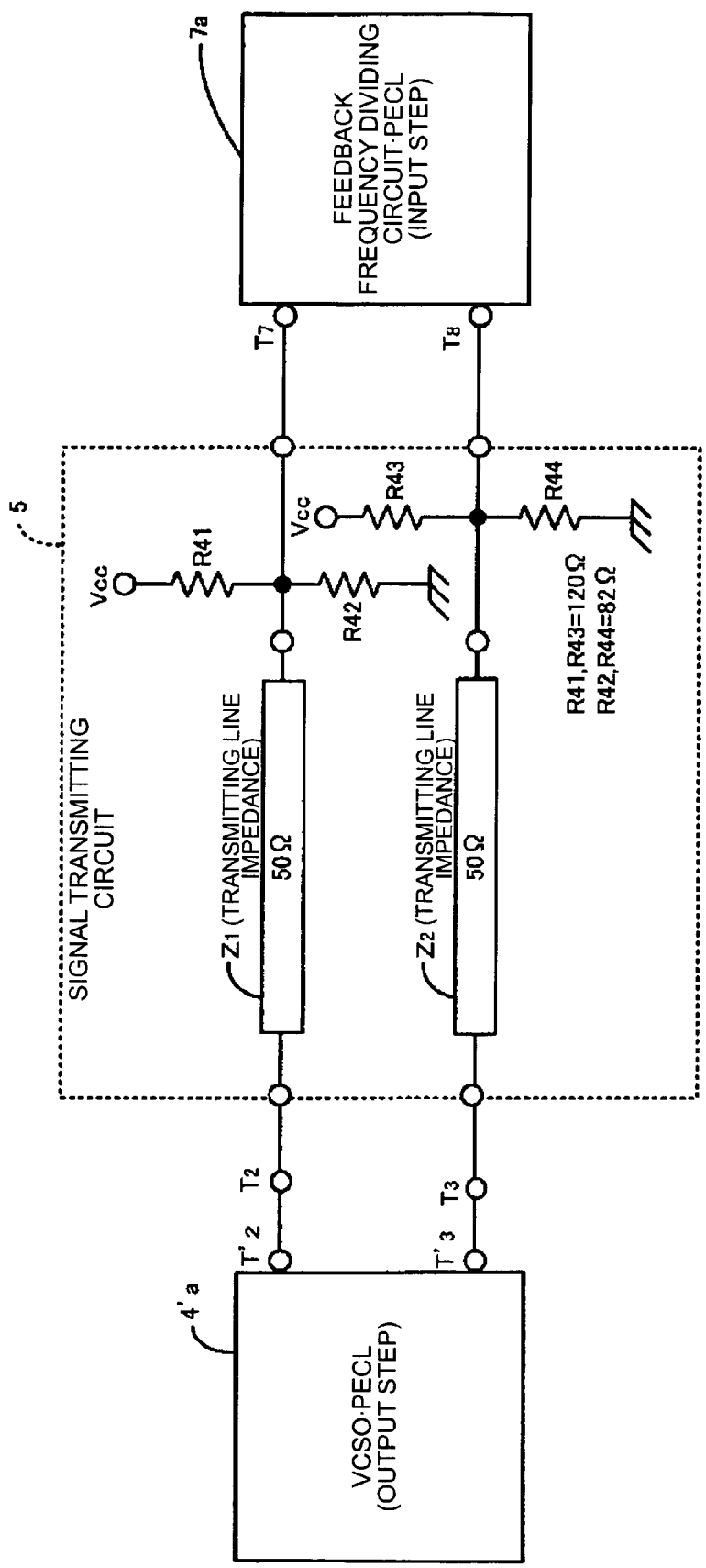
FIG. 11 is a block diagram of a conventional signal transmitting circuit between the PECL of the output step of the VCO and the PECL of the input step of the feedback frequency dividing circuit of the phase detector IC chip in the clock converter illustrated in FIG. 10.

An application example of the clock converter realized by the above embodiments to an electronic apparatus will be described. FIG. 8 is a schematic block diagram of a 10 gigabit-optical interface using the clock converter according to the present invention. A module 100 for an optical network-dedicated optical transceiver realized an interface function for performing a photo-electric conversion and an electro-optical conversion, and multiplexing and demultiplexing between a server computer and an optical network. In the optical transceiver module 100, a high frequency clock signal generated from a clock converter 103 is used as a reference clock signal of a multiplexer (MUX) 101.

Each block has the following function.

The multiplexer (MUX) 101 multiplexes a plurality of low speed transmission data (TxDATA×N) received from a lower system. Herein, N is an integer, say, 16. An electro-optical converter (TxE-O) 102 converts an electric signal into an optical signal (OPOUT) and transmits the optical signal (OPOUT) to an optical transmission line. A photo-electric converter (RxO-E) 105 converts an optical signal (OPIN) received from the optical transmission line into an electric signal. A demultiplexer (DeMUX/CDR) 104 demultiplexes the received data converted into an electric signal by the optical/electric converter (RxO-E) 105 into a plurality of low speed receiving data (RxDATA×N). A clock converter 103 multiplies a low frequency clock signal to a high frequency clock signal and supplies the high frequency reference clock signal to the multiplexer (MUX) 101. A selector 106 selects a desired clock signal from a low frequency external clock signal (TxREF) or a clock signal (RxCLK) from the demultiplexer (DeMUX/CDR) 104 and supplies the selected clock signal to the clock converter 103.

The operation of the optical transceiver module 100 will be described. The clock converter 103 converts the low frequency external clock signal (TxREF) selected by the selector 106 into a high frequency clock signal. For example, when the selector 106 selects the low frequency external clock signal (TxREF) of 64 kHz to 155.52 MHz and supplies the selected external clock signal (TxREF) to the clock converter 103, the clock converter 103 converts the clock signal (TxREF) into a high frequency clock signal of 622.08 MHz of a 600 MHz band and supplies the clock signal to the multiplexer (MUX) 101. Accordingly, the electro-optical converter (TxE-O) 102 transmits an optical signal (OPOUT) of OC-192 (a 10 GHz bandwidth) to the optical transmission line.

In addition, the demultiplexer (DeMUX/CDR) 104 extracts a high frequency clock signal from the data of the optical signal (OPIN) received from the photo-electric converter (RxO-E) 105 by a CDR (clock and data recovery) function. When the selector 106 selects a clock signal (RCLK), jitter is reduced in the clock signal (RCLK) with a large amount of jitter. Then, a high frequency clock signal with a small amount of jitter is supplied from the clock converter 103 to the multiplexer (MUX) 101.

That is, when the clock converter 103 according to the present invention is used for the optical transceiver module 100, the clock converter 103 can generate a high frequency clock signal with a small amount of jitter even if a clock signal supplied from the outside is used, and supply the clock signal to the multiplexer (MUX) 101 without being affected by peripheral circuits connected to the clock converter 103. Accordingly, a timing margin between the transmission data (TxDATA×N) multiplexed from the multiplexer (MUX) 101 and a clock signal is secured. Therefore, it is possible to prevent the wrong operation of the transmission data of the multiplexer (MUX) 101.

Furthermore, the clock converter 103 occupies a smaller space by attempts of forming a fine wiring pattern and reducing the number of parts on the substrate as mentioned above. Therefore, it is possible to minimize the size of the optical transceiver module 100 and to reduce the price of the optical transceiver module 100 by using such a clock converter 103. Moreover, it is possible to easily secure a stable operation of a high-speed network system, such as the 10 gigabit Ethernet (a registered trademark), capable of transmitting a large amount of data, such as a moving picture, by using the clock converter according to the present invention.

The above embodiments are an example for describing the present invention. The present invention is not restricted to the above embodiments, and various modifications can be made within the scope of the subject matter of the present invention. For example, the clock converter including the VCSO using the SAW resonator is mentioned in the above embodiments, but is not restricted to this. For example, as illustrated in FIG. 2, it is possible to realize the clock converter according to the present invention by the VCXO using the high frequency AT crystal oscillator 17. The clock converter according to the present invention can be also realized by the VCO using a piezo-electric oscillator without being restricted to the SAW resonator or the AT crystal oscillator.

MODIFICATIONS

First Modification

Furthermore, the case where the oscillation circuit is used for the network-dedicated optical transceiver module is described, but the oscillation circuit can be applied to various electronic apparatuses, such as mobile telephones and radio communication apparatuses, which require the oscillation circuit, in particular, a high frequency oscillation circuit.

Second Modification

Moreover, in principle, the positive feedback loop is formed in the order of the SAW resonator→ an amplifier (including a feedback buffer amplifier)→ the voltage controlled phase shifting circuit. However, the positive feedback loop may be formed such that the position of the SAW resonator is exchanged for the position of the voltage controlled phase shifting circuit in the positive feedback loop.

Third Modification

Langasite ($La_3Ga_5SiO_{14}$) or a lithium tetra borate other than crystal can be used as a piezo-electric material forming a piezo-electric oscillator, such as a crystal oscillator, a ceramic oscillator or the SAW resonator.

ADVANTAGES

As mentioned above, according to the clock converter of the present invention, because the PLL feedback loop is drawn out from the differential buffer, it is possible to realize the PLL feedback loop that is not affected by the instability of the amplitude or the deformation of the waveform of the clock signal, which is caused by a change in the load at the output of the VCSO. Furthermore, it is possible to reduce the space of the signal transmitting circuit by using only one wiring pattern for the PLL feedback loop and to realize a small and inexpensive clock converter because it is not necessary to newly add a buffer differential converting circuit.

Furthermore, it is not necessary to use a strip line or a dedicated cable of 50 Ω like in a conventional technology when the signal transmitting circuit is arranged between the PECL of the output step of the VCSO and the PECL of the input step of the feedback frequency dividing circuit in the phase detector IC chip, that is, between the PECL and the PECL. Moreover, it is possible to perform the impedance matching and to form the PLL feedback loop combining with the DC bias means by the layout of the wiring pattern and the parts formed on the substrate. Therefore, it is possible to reduce the space of the signal transmitting circuit a little smaller.

In addition, it is possible to reduce the space of the substrate because it is possible to form the low impedance line of 50 Ω for receiving and transmitting a clock signal by a fine wiring pattern by using the substrate of high permittivity. Furthermore, it is possible to realize a clock converter with a high noise margin because it is possible to form a capacitor for passing a high frequency noise by increasing the line width of the wiring pattern at the side of ground among the discrete parts, such as the resistors and the capacitor for matching the impedance.

Also, when the signal transmitting circuit is arranged between the PECL of the output step of the VCSO and the differential CMOS of the input step of the feedback frequency dividing circuit in the phase detector IC chip, that is, between the PECL and the differential CMOS circuit, it is possible to let the bias resistance of the input of the differential CMOS have a high impedance (500 Ω to 1 kΩ), compared to the transmission line impedance (50 Ω) since the input impedance of the differential CMOS circuit is high. Therefore, because it is possible to increase the amplitude of the clock signal of the input of the phase detector circuit, the waveforms of the clock signal are produced with high inclines and declines. Accordingly, it is possible to output a jitter-reduced clock signal, to thus realize a clock converter with a high frequency precision for a short time.

Furthermore, because it is possible to use a high impedance line for the PLL feedback loop between the PECL and the differential CMOS circuit, it is possible to reduce the line width of the wiring pattern, to thus reduce the space of the substrate. Moreover, because it is possible to increase the termination resistance of the VSCO·PECL by increasing the impedance of the PLL feedback loop, it is possible to reduce the power consumption by the clock converter.

The entire disclosure of Japanese Patent Application No. 2002-279284 filed Sep. 25, 2002 is incorporated by reference.

What is claimed is:

1. A clock converter for synchronizing the phase of a phase locked loop (PLL) feedback signal output from voltage controlled oscillating means with the phase of an input signal using phase detector means, to output a clock signal of a predetermined frequency, comprising:
    voltage controlled oscillating means for outputting a positive feedback signal for a positive feedback loop, the voltage controlled oscillating means including:
        a first buffer forming a portion of the positive feedback loop that outputs the positive feedback signal from one output terminal of the first buffer, which uses voltage controlled phase shifting means, and that outputs the PLL feedback signal from another output terminal of the first buffer; and
        a second buffer that outputs the clock signal.

2. The clock converter according to claim 1, wherein at least one of the first buffer and the second buffer further comprises an ECL (emitter coupled logic) differential amplifying circuit.

3. The clock converter according to claim 1, wherein:
    the PLL feedback signal output from the first buffer is fed back to the phase detector means through signal transmitting means for adjusting impedance; and further comprising feedback frequency dividing means for dividing the frequency of the PLL feedback signal.

4. The clock converter according to claim 3, wherein:
    in the signal transmitting means, the PLL feedback signal supplied from the first buffer is supplied to a first connection point between a first resistor and a second resistor among first to third resistors connected in series between a power source and a ground;
    a second connection point between the second resistor and third resistor is connected to the ground through a first capacitor;
    the first connection point is connected to a first input terminal of a differential ECL amplifier in the feedback frequency dividing means; and
    the second connection point is connected to a second input terminal of the differential ECL amplifier in the feedback frequency dividing means.

5. The clock converter according to claim 3, wherein:
    in the signal transmitting means, the PLL feedback signal supplied from the first buffer is supplied to a first connection point between the first resistor and the second resistor among first to third resistors connected in series between a power source and a ground through a second capacitor;
    a second connection point between the second resistor and third resistor is connected to the ground through a first capacitor;
    the first connection point is connected to a first input terminal of a differential CMOS amplifier in the feedback frequency dividing means; and the second connection point is connected to a second input terminal of the differential CMOS amplifier in the feedback frequency dividing means.

6. The clock converter according to claim 4, wherein, when the resistance value of the second resistor is $R_M$, and the resistance values of the first and the third resistors connected to both ends of the second resistor are $R_H$ and $R_L$, respectively, then $R_H \gg R_M$ and $R_L \gg R_M$.

7. The clock converter according to claim 4, wherein an output terminal of the differential amplifying circuit forming the first buffer is connected to a termination resistor with a resistance value larger than that of the output impedance of the differential amplifying circuit.

8. The clock converter according to claim 5, wherein, when the resistance value of the second resistor is $R_M$, and the resistance values of the first and the third resistors connected to both ends of the second resistor are $R_H$ and $R_L$, respectively, then $R_H \gg R_M$ and $R_L \gg R_M$.

9. A clock converter for synchronizing the phase of a phase locked loop (PLL) feedback signal output from voltage controlled oscillating means with the phase of an input signal using phase detector means, to output a clock signal of a predetermined frequency, comprising:

voltage controlled oscillating means for outputting a positive feedback signal for a positive feedback loop, the voltage controlled oscillating means including:

a first buffer forming a portion of the positive feedback loop that outputs the positive feedback signal from one output terminal of the first buffer, which uses voltage controlled phase shifting means, and that outputs the PLL feedback signal from another output terminal of the first buffer; and a second buffer that outputs the clock signal; and feedback frequency dividing means for dividing the frequency of the PLL feedback signal, wherein:

the PLL feedback signal output from the first buffer is fed back to the phase detector means through signal transmitting means for adjusting impedance;

in the signal transmitting means, the PLL feedback signal supplied from the first buffer is supplied to a first connection point between a first resistor and a second resistor among first to third resistors connected in series between a power source and a ground;

a second connection point between the second resistor and third resistor is connected to the ground through a first capacitor;

the first connection point is connected to a first input terminal of a differential ECL amplifier in the feedback frequency dividing means; and the second connection point is connected to a second input terminal of the differential ECL amplifier in the feedback frequency dividing means.

10. A clock converter for synchronizing the phase of a phase locked loop (PLL) feedback signal output from voltage controlled oscillating means with the phase of an input signal using phase detector means, to output a clock signal of a predetermined frequency, comprising:

voltage controlled oscillating means for outputting a positive feedback signal for a positive feedback loop, the voltage controlled oscillating means including:

a first buffer forming a portion of the positive feedback loop that outputs the positive feedback signal from one output terminal of the first buffer, which uses voltage controlled phase shifting means, and that outputs the PLL feedback signal from another output terminal of the first buffer; and a second buffer that outputs the clock signal; and feedback frequency dividing means for dividing the frequency of the PLL feedback signal, wherein:

the PLL feedback signal output from the first buffer is fed back to the phase detector means through signal transmitting means for adjusting impedance;

in the signal transmitting means, the PLL feedback signal supplied from the first buffer is supplied to a first connection point between the first resistor and the second resistor among first to third resistors connected in series between a power source and a ground through a second capacitor;

a second connection point between the second resistor and third resistor is connected to the ground through a first capacitor;

the first connection point is connected to a first input terminal of a differential CMOS amplifier in the feedback frequency dividing means; and the second connection point is connected to a second input terminal of the differential CMOS amplifier in the feedback frequency dividing means.

\* \* \* \* \*